US011028659B2

United States Patent
Song et al.

(10) Patent No.: US 11,028,659 B2
(45) Date of Patent: Jun. 8, 2021

(54) SYSTEMS AND METHOD UTILIZING PIEZOELECTRIC MATERIALS TO MITIGATE OR ELIMINATE STICK-SLIP DURING DRILLING

(71) Applicant: University of Houston System, Houston, TX (US)

(72) Inventors: Gangbing Song, Pearland, TX (US); Devendra Patil, Houston, TX (US); Qingzhao Kong, Houston, TX (US); Robello Samuel, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 121 days.

(21) Appl. No.: 16/097,879

(22) PCT Filed: May 2, 2017

(86) PCT No.: PCT/US2017/030571
§ 371 (c)(1),
(2) Date: Oct. 31, 2018

(87) PCT Pub. No.: WO2017/192539
PCT Pub. Date: Nov. 9, 2017

(65) Prior Publication Data
US 2019/0153800 A1    May 23, 2019

Related U.S. Application Data

(60) Provisional application No. 62/330,454, filed on May 2, 2016.

(51) Int. Cl.
*E21B 31/00* (2006.01)
*E21B 10/42* (2006.01)
(Continued)

(52) U.S. Cl.
CPC ............ *E21B 31/005* (2013.01); *E21B 10/42* (2013.01); *E21B 31/035* (2020.05); *E21B 44/00* (2013.01); *E21B 47/024* (2013.01); *H01L 41/092* (2013.01)

(58) Field of Classification Search
CPC ........ E21B 10/36; E21B 31/005; E21B 10/42; E21B 47/024; E21B 44/00; H01L 41/092
See application file for complete search history.

(56) References Cited

U.S. PATENT DOCUMENTS 6,863,136 B2 *    3/2005    Bar-Cohen ................ E21B 7/24
                                                            175/20
7,740,088 B1      6/2010    Bar-Cohen et al.
(Continued)

FOREIGN PATENT DOCUMENTS

| WO | 2006007572 | 1/2006 |
| WO | 2007141550 | 12/2007 |
| WO | 2007149866 | 12/2007 |

OTHER PUBLICATIONS

Baker Hughes, "Kymera Hybrid Drill Bit Technology,".[Online]. Available: http://www.bakerhughes.com/products-and-services/drilling/drill-bit-systems/kymera-hybrid-drill-bit-technology. [Accessed Feb. 22, 2016].

(Continued)

*Primary Examiner* — Michael R Wills, III
(74) *Attorney, Agent, or Firm* — Winstead PC

(57) ABSTRACT

Improved drilling systems and methods may include piezoelectric actuator(s) in a drill string at one or more locations to minimize or eliminate stick-slip while drilling. For example, piezoelectric actuators may be incorporated into the rock bit or drill bit in the openings in the bit body for receiving the cutters. As another example, the piezoelectric actuators may be incorporated into an independent module that is place on or in the drill string. The independent module (Continued)

may be placed between the top drive and the drill bit or at the top of the drill string near a top drive.

21 Claims, 6 Drawing Sheets

(51) Int. Cl.
*E21B 47/024* (2006.01)
*E21B 44/00* (2006.01)
*H01L 41/09* (2006.01)

(56) References Cited

U.S. PATENT DOCUMENTS

| | | | |
|---|---|---|---|
| 7,748,474 | B2 | 7/2010 | Watkins et al. |
| 8,640,786 | B2* | 2/2014 | Aldrich ............. B23B 37/00 |
| | | | 173/104 |
| 8,910,727 | B2* | 12/2014 | Bar-Cohen ......... B25D 11/064 |
| | | | 173/142 |
| 8,925,648 | B2* | 1/2015 | Lucon ................ E21B 44/00 |
| | | | 175/56 |
| 10,294,727 | B2* | 5/2019 | Nguyen .............. E21B 47/00 |
| 2010/0051292 | A1 | 3/2010 | Trinh et al. |
| 2011/0120772 | A1 | 5/2011 | McLoughlin et al. |
| 2012/0037390 | A1* | 2/2012 | Bao .................. E21B 1/02 |
| | | | 173/113 |
| 2016/0053546 | A1 | 2/2016 | Samuel et al. |
| 2016/0053547 | A1* | 2/2016 | Samuel ............... E21B 7/24 |
| | | | 175/57 |
| 2017/0022762 | A1* | 1/2017 | Larsen ............... E21B 28/00 |
| 2017/0159369 | A1* | 6/2017 | Evans ............... E21B 43/26 |
| 2017/0226806 | A1* | 8/2017 | Nguyen ............. E21B 47/00 |

OTHER PUBLICATIONS

Tomax, "Anti Stick-Slip Tool—AST". [Online]. Available: http://www.tomax.no/products/about-ast/. [Accessed Feb. 22, 2016].
National Oilwell Varco, "Soft Speed II". [Online]. Available: http://www.nov.com/softspeedII/. [Accessed Feb. 22, 2016].
APS Technology, "Active Vibration Damper Sub (AVD)". [Online]. Available: http://www.aps-tech.com/products/drilling-optimization/active-vibration-damper. [Accessed Feb. 22, 2016].
Bentec, "Soft Torque Rotary System". [Online]. Available: http://www.bentec.com/equipment/electrical-products/soft-torque-rotary-system/. [Accessed Feb. 22, 2016].
Electro Project, "Soft Torque". [Online]. Available: http://www.softtorque.com/system-advantages. [Accessed Feb. 22, 2106].
Halliburton, "Geo Pilot GTX Rotary Steerable system". [Online]. Available: https://www.halliburton.com/en-US/ps/sperry/drilling/directional-drilling/rotary-steerables/. [Accessed Feb. 22, 2016].
Sherrit, Stewart et al., "Single Piezo-Actuator Rotary-Hammering (SPaRH) Drill," Proceedings of SPIE Smart Structures and Materials, San Diego, 2012, paper # 8345-79.
Domm, Lukas N., "Development of a Piezoelectric Rotary Hammer Drill," Jet Propulsion Laboratory (2011).
Bar-Cohen, Yoseph, et al. "Deep drilling and sampling via the wireline auto-gopher driven by piezoelectric percussive actuator and EM rotary motor." SPIE Smart Structures and Materials+ Nondestructive Evaluation and Health Monitoring. International Society for Optics and Photonics, 2012.

* cited by examiner

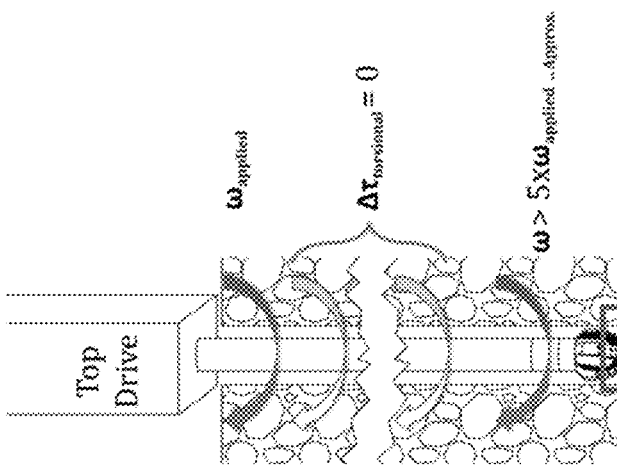
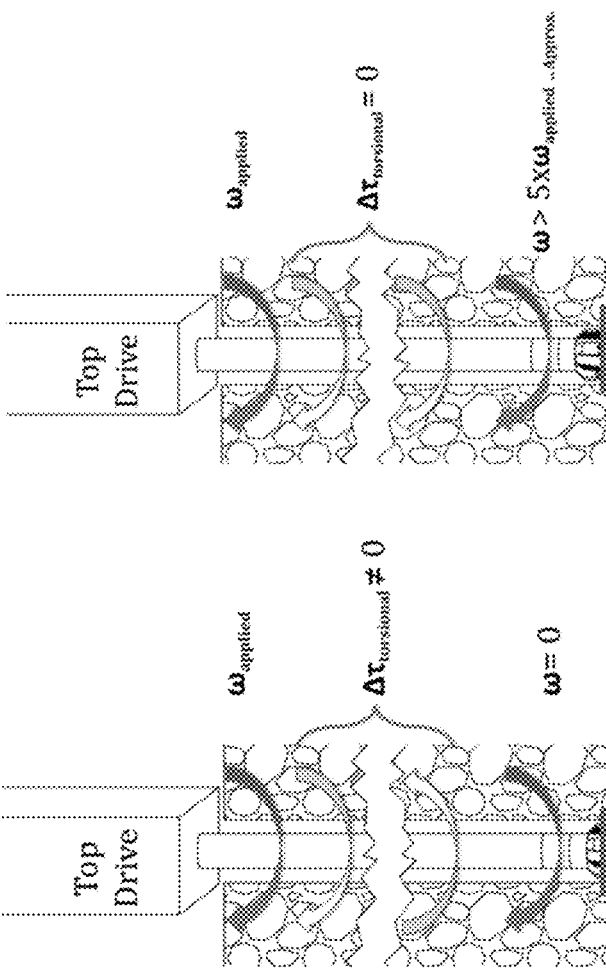
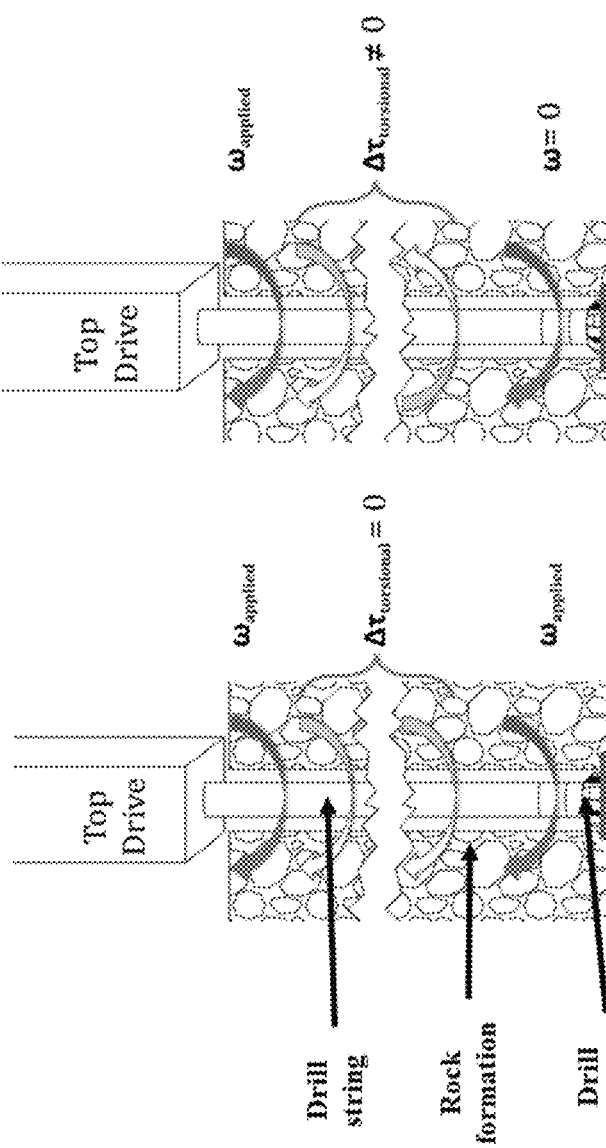
(Prior Art)

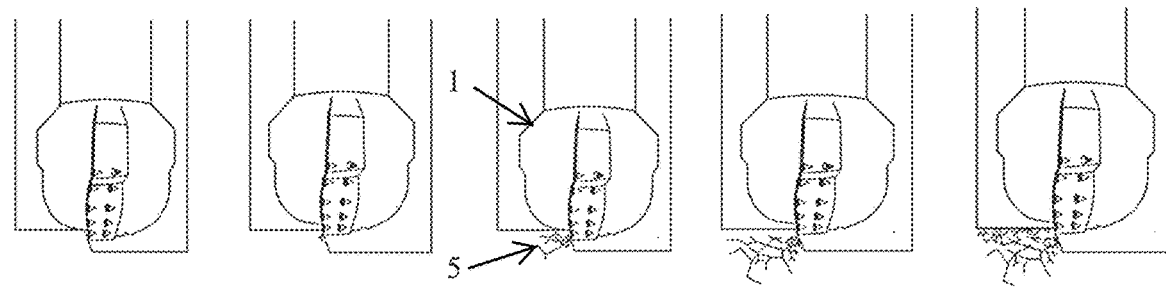
Figure 2
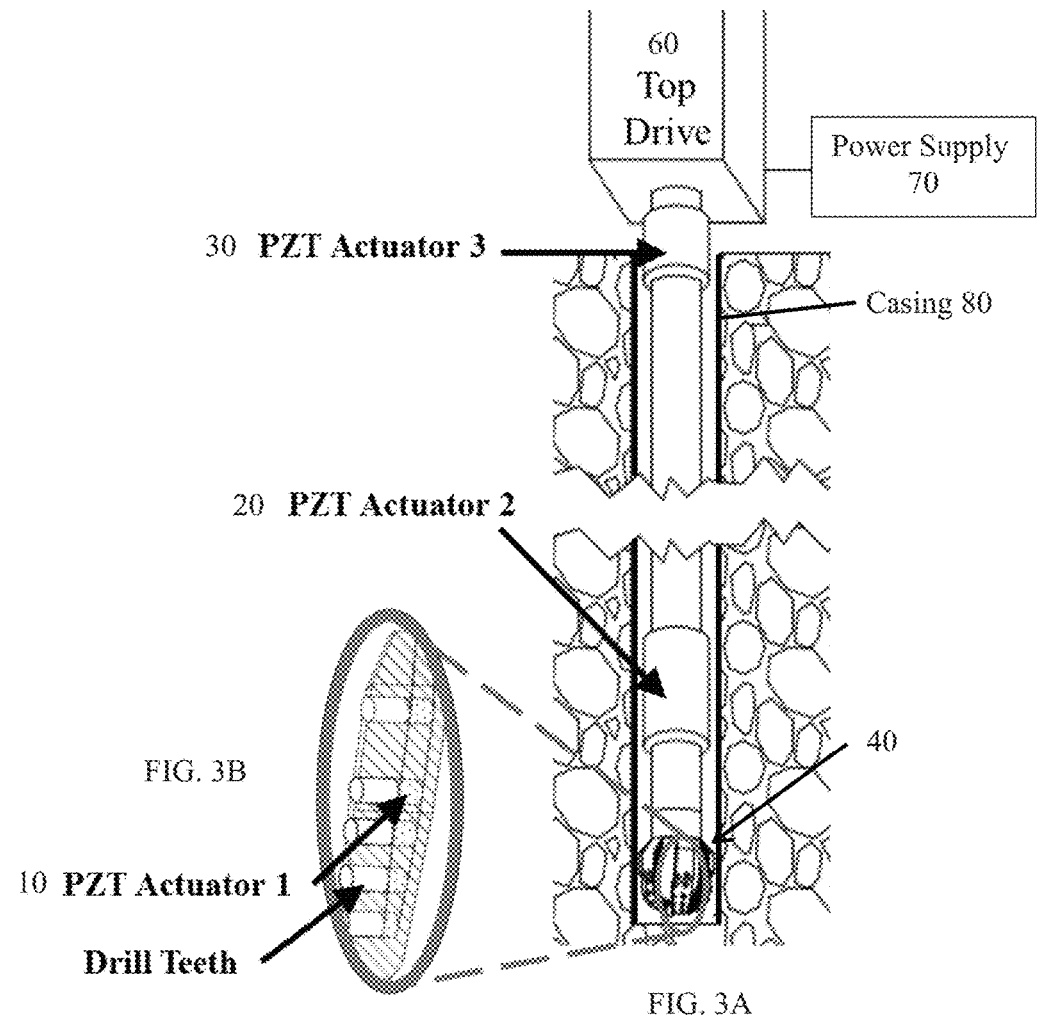

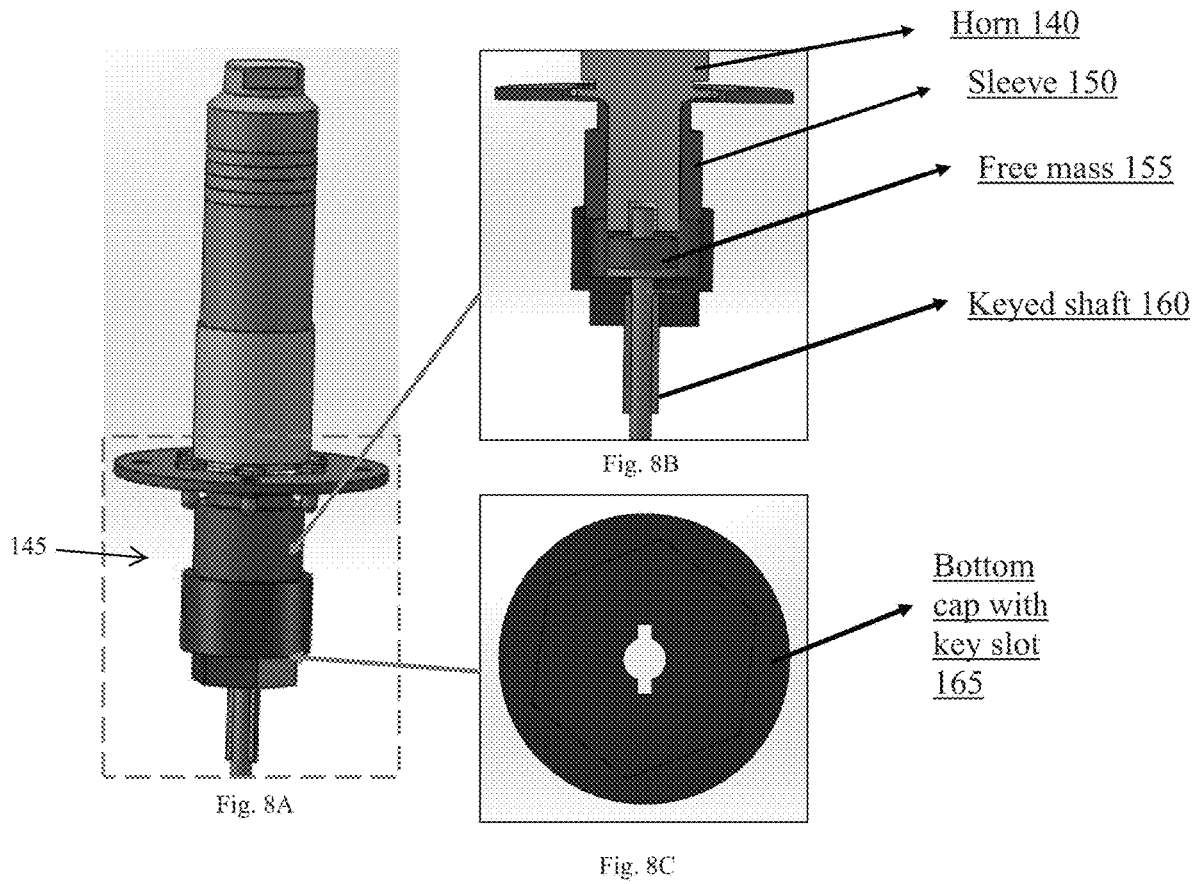

SYSTEMS AND METHOD UTILIZING PIEZOELECTRIC MATERIALS TO MITIGATE OR ELIMINATE STICK-SLIP DURING DRILLING

RELATED APPLICATIONS

This application claims the benefit of U.S. Provisional Patent Application No. 62/330,454 filed on May 2, 2016, which is incorporated herein by reference.

FIELD OF THE INVENTION

This invention relates to utilizing piezoelectric materials in a drilling system. More particularly, to systems and methods utilizing piezoelectric materials to minimize or eliminate stick-slip during drilling.

BACKGROUND OF INVENTION

Stick-slip action in drilling is characterized by the absorption and sudden release of large amount of energy due to interplay between static and dynamic friction between the drill bit surface and the rock being drilled. Occurrence of the stick-slip in long drill strings results in twisting of drill string by several turns (extremely high torsional stresses) during stick phase and sudden high rotational speed (e.g. up to 5×) of BHA during slip phase, as shown FIG. 1.

This undesirable behavior of the drill string due to stick-slip phenomenon leads to torsional vibrations, unwanted wear and premature failure of bit. Excessive stick-slip could also lead to complete failure of motor and other expensive devices in drill string. Reduction in the Weight on Bit (WOB) is usually employed to avoid stick slip, but doing so reduces the Rate of Penetration (ROP) and increases the non-productive time (NPT) (by up to 50%), which is an important consideration associated with financial aspect of the drilling operation.

Attempts to solve stick-slip problems include custom made, expensive drill bits or/and advance control algorithms which need to be modified for every drilling site and require expert personnel to operate. A few examples of such devices include a hybrid drill bit combining roller cones and Polycrystalline Diamond Compact (PDC) fixed cutters, internal mechanisms, or control algorithms.

One example of a drill bit using piezoelectric materials is an Ultrasonic-Sonic Driller Corer (USDC) using Piezoceramic material, which has been developed by NASA for planetary missions. The piezoelectric material was placed above drill bit. The prototype developed had limited force generation capacity. Also, the prototype was limited to collecting the core samples.

While piezoceramics have been used in the oil and gas industry, they have mainly been used as acoustic or ultrasonic transmitters and receivers or strain sensors for Measurement While Drilling (MWD), Logging While Drilling (LWD), cement bond evaluation, mud density evaluation, casing descaling, formation flow enhancement, and casing thickness inspection.

In the systems and methods discussed further herein, piezoelectric materials are utilized in a drill string to reduce or eliminate stick-slip.

SUMMARY OF INVENTION

In one embodiment, piezoelectric actuator(s) may be incorporated into a drill string in one or more locations. In some embodiments, piezoelectric actuators may be incorporated into the rock bit or drill bit. In particular, the openings in the bit body for receiving the cutters, such as polycrystalline diamond compact (PDC) inserts, may receive the piezoelectric actuators. The piezoelectric actuators may be incorporated in some or all of the openings in the bit body, and the cutters or PDC inserts may be placed in the openings on top of the actuators. In some embodiments, the piezoelectric actuators may be incorporated in an independent module that is place on or in the drill string. In some embodiments, the independent module may be placed between the top drive and the drill bit, before or/and after Bottom Hole Assembly (BHA). The BHA is the lower portion of the drillstring comprising (from the bottom up in a vertical well) the bit, bit sub, a mud motor (in certain cases), stabilizers, drill collar, heavy-weight drillpipe, jarring devices ("jars") and crossovers for various threadforms. The BHA provides force for the bit to break the rock (weight on bit) and provides the driller with directional control of the well. In some embodiments, the independent module may be placed at the top of the drill string near a top drive. In some embodiments, a mechanical system may be incorporated to change high frequency (e.g. ultrasonic), low amplitudes vibrations generated from piezoceramic actuator to low frequency (e.g. sonic), high amplitude vibrations at the drill bit. This system may be comprised of free mass or free to move uncoupled connection between piezoceramic actuator and the drill bit or string.

In one embodiment, a system for avoiding stick slip during drilling operations may include at least one piezoelectric plate, an ultrasonic horn coupled to the piezoelectric plate that concentrates vibrational energy at a tip of the ultrasonic horn, and a keyed shaft that is utilized to couple the system to a drill bit. Further, a bottom cap assembly may be coupled to the ultrasonic horn to provide a free mass chamber, which houses a free mass. The free mass may translate vibrations received from the piezoelectric plate into lower frequency and higher amplitude vibrations. The bottom cap assembly may also include a sleeve coupled to the ultrasonic horn, and a bottom cap coupled to the sleeve. The bottom cap may provide a keyed slot, and a keyed portion of the keyed shaft may fit through the keyed slot.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 1A-1C are illustrations of a bit before stick-slip, during the stick phase, and during the slip phase;

FIG. 2 illustrates rock cracking (during stick phase) with a bit in an ultrasonic drilling mode;

FIGS. 3A-3B respectively show an illustrative embodiment showing placement positions for a piezoelectric actuator in a drill string and an enlarged cross-section view of a drill bit with incorporated piezoelectric actuators;

FIGS. 8A-8C respectively show a piezoelectric actuator stack, a cross-section view of the bottom, and nonlimiting keyed bottom cap.

DETAILED DESCRIPTION

Figure 4:
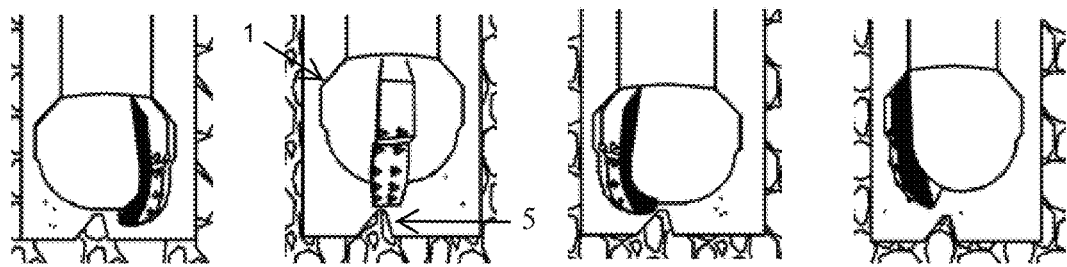
FIG. 4 illustrates the avoidance stick-slip during activation of the piezoelectric-based system and method.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

A novel system and method is proposed to eliminate rock bit stick-slip by using piezoelectric actuator(s) to generate high-frequency vibration chattering or ultrasonic vibration. The piezoelectric actuator(s) may be placed in one or more locations of a drill string, such as near the top drive, an intermediate location between the top drive and the drill bit, and/or within the drill bit. The piezoelectric actuators discussed herein may be selected from any suitable piezoelectric material, such as lead zirconate titanate (or PZT), a piezoceramic, or the like. In some embodiments, the piezoelectric actuators of the system may be operable at any frequency. The system does not require manipulation of loading parameters during drilling to achieve a desired frequency or operation at a resonant frequency of the material being drilled. In some embodiments, the system may be active during any drilling activities.

The piezoelectric actuator(s) will introduce chattering of very small displacement, but at high frequency (e.g., possibly in the range of several to several-hundred kHz), to the rock or drill bit so that the rock bit is always chattering and the "stick" phase can be avoided. The advantages of utilizing piezoelectric actuator(s) include low power requirements, scalability, high energy efficiency, wide range bandwidth of actuation frequency (e.g. sub-one Hertz to mega Hertz), and commercial availability.

It should be also noted that the low-magnitude and high frequency chattering does not harm the rock bit 1 or the drill string since the induced strain is very small. If the tendency of stiction (static friction) is high or stiction is already in process, the piezoelectric actuator in the drill string can operate in the ultrasonic range to break the rock 5 as "an ultrasonic drilling machine." Further, using the piezoelectric actuator may also prevent the stick-slip from happening or break the stiction. FIG. 2 (from left to right) shows the breaking of rock 5 in ultrasonic mode.

FIG. 3A is an illustrative embodiment showing placement positions for a piezoelectric actuator system in a drill string. There are three options to place the piezoelectric actuator system(s) 10, 20, 30 (or piezoactuators), and these actuator(s) may be placed in one or more of these locations. In some embodiments, the piezoelectric actuators 10 may be integrated with the rock bit 40, which requires the redesign of the rock bit. A rock or drill bit 40, such as a fixed cutter drill bit or roller cone bit, is typically attached to the bottom of the drill string. The portions of the bit 40 impacting or contacting the formation may provide several openings for receiving drilling inserts or cutters. As shown by the enlarged view of FIG. 3B, piezoelectric actuators 10 may be incorporated in a drill bit 40. In some embodiments, the drill bit 40 may have openings that allow several drill teeth or drilling insert 50 to be embedded that provide the cutting surfaces that contact the formation to be drilled. In some embodiments, the body of the bit 40 may have multiple blades that define the cutting profile of the bit. As a non-limiting example, fixed cutter bits (e.g. FIG. 3B) may provide blades having openings to receive drill teeth 50, which are polycrystalline diamond compact (PDC) insert that are embedded into openings in the blades of the bit 40. It shall be apparent to one of ordinary skill in the art that the nonlimiting example shown is a fixed cutter bit. In other embodiments, the bit may be any other suitable type of bit, such as a roller cone bit. Further, while the nonlimiting examples herein discuss stick-slip, the system may be utilized for other purposes as well, such as improving rate of penetration (ROP). In conventional bits, the PDC insert are positioned in the openings on the blades of the bit without any other intermediate component between the bottom of the opening. In the enlarged view shown in FIG. 3B, a piezoelectric actuator 10 is placed at the bottom of the opening in the bit 40 for the PDC insert or drilling insert 50, and the PDC insert is placed on top. In some embodiments, piezoelectric actuators 10 may be placed in all of the openings in the bit 40 for the PDC inserts. In other embodiments, piezoelectric actuators 10 may be strategically placed in a few of the openings in the bit 40. It is known in the art that piezoelectric materials may deform in response to having electricity applied. Thus, the piezoelectric actuator(s) 10 should be set up to allow a voltage differential to be applied to them when desired. In some embodiments, a first end of installed piezoactuators 10 closest to the bottom of the opening in bit 40 could be electrically isolated from metal body of drill bits with nonconductive coating to avoid the potential risk of shorting. In some embodiments, the first end of installed piezoactuators 10 closest to the bottom of the opening in bit 40 electrically connected to the first pole of power supply 70. In some embodiments, the second pole of the power supply 10 may be coupled to the drill casing 80. Further, the second end of actuators could be in electric contact with drill casing 80, thereby allowing the whole drill casing to act as the secondary pole for actuation purposes of piezoactuators 10.

The second option for placement of the piezoelectric actuator system(s) 20 is an independent module or drill string attachment that can be installed on the drill string between top drive 60 and the rock bit 40, before or/and after Bottom Hole Assembly (BHA). In some embodiments, the piezoelectric actuator system(s) 20 may be incorporated in a BHA. In some embodiments, the piezoelectric attachment 20 may form the part of drill string. For example, the system may be designed as a sleeve on the end of the drill string above the bottom hole assembly (BHA). A drill string may have a variety of components attached to a top drive 60 that rotates the bit 40. In some embodiments, a piezoelectric module 20, 30 may be position at any location between the top drive 60 and the rock bit 40. In some embodiments, power for piezoelectric actuator system(s) 20, 30 in first and second placement options could be provide from power cables from the surface or could be generated locally using power generators driven by mud/drilling fluid.

The third option for placement of the piezoceramic actuator 30 module is at the top end of drill string near surface or top drive 60. In some embodiments, power for piezoelectric actuator 30 near the surface could be provide from power cables from the surface. In this configuration, vibrations will travel through drill string to bit 40. Further, wiring to piezoelectric actuator 30 requires less wiring compared to actuators 10 or 20, as the actuator 30 is near the surface. This configuration allows the use of large piezoelectric actuator 30 due to ease of availability of large power supply on top.

In the three piezoelectric actuator placement configurations discussed, the vibrations created by the piezoelectric actuators system(s) 10, 20, 30 are transferred to the formation in contact with the bit 40 since stress-waves can propagate through a drill string. It should be noted that actuator used to generated vibrations is not limited to piezoelectric actuators. In other embodiments, electrical, hydraulic, and/or mechanical actuators can be used to generate vibrations.

In some embodiments, a set of one or more free/moving masses could be added to the design to modify the impact vibration frequency and amplitude at the drill bit tip. These additional masses alter the high frequency (e.g. ultrasonic or higher freq.), low amplitude vibrations from piezoelectric actuator to lower frequency (e.g. sonic) and higher amplitude vibrations. In some embodiments, free/moving masses could be removed by reserving a vertical free space with uncoupled connection between piezoelectric or piezoceramic actuator and the drill bit or string to provide the vertical vibration flexibility of the drill bit.

Figures 6A, 6B:
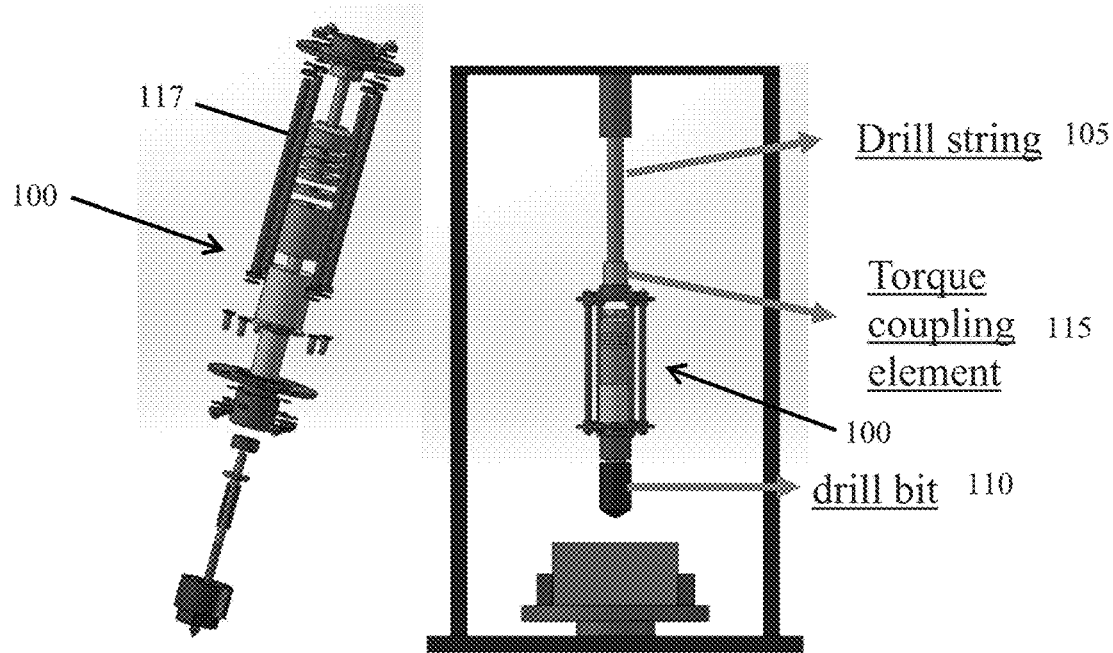
FIGS. 6A-6B respectively show a nonlimiting example of a piezoelectric actuator stack and a piezoelectric actuator stack incorporated with a drill string.
Figure 7:
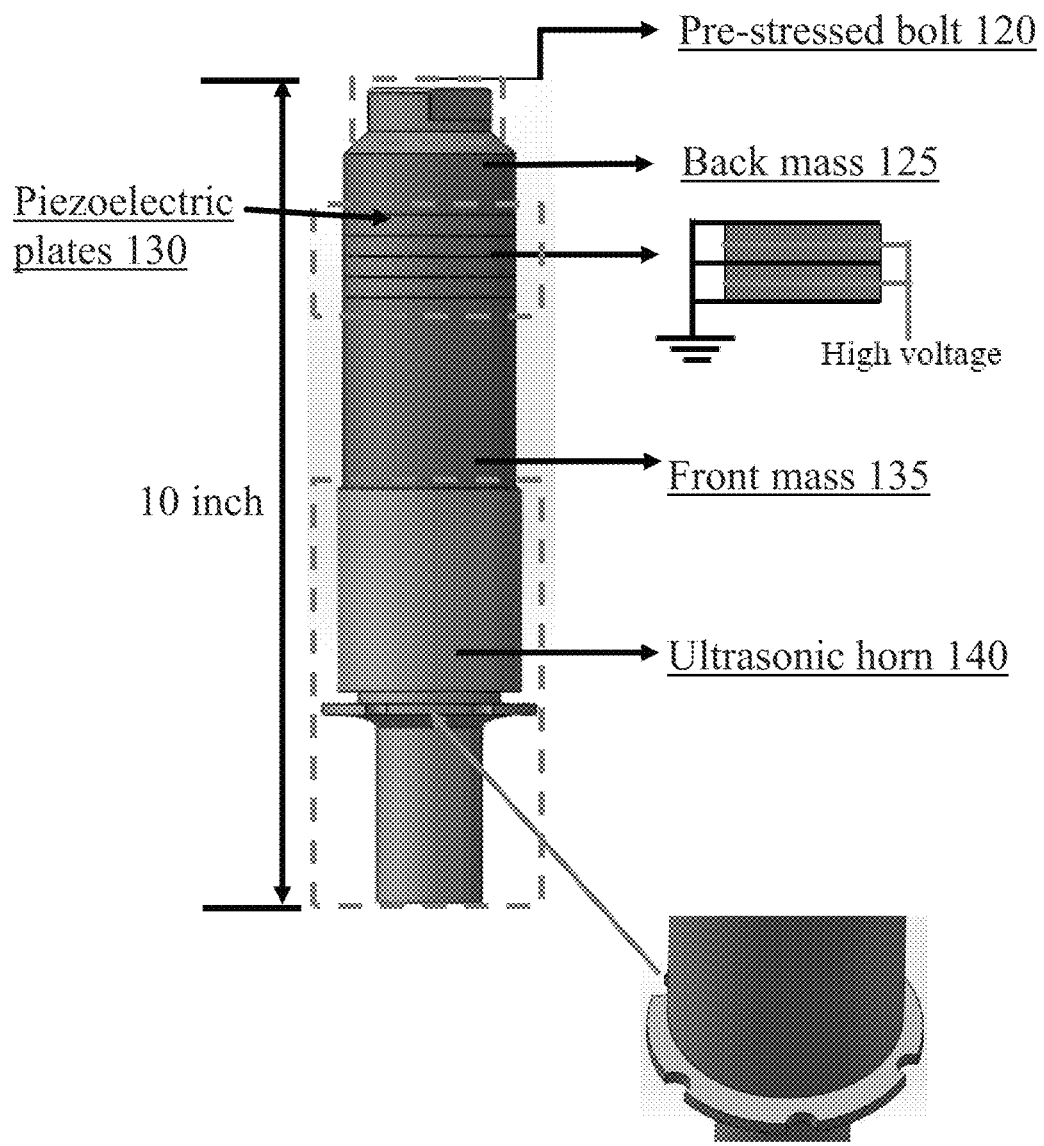
FIG. 7 shows an enlarged view of a nonlimiting top portion of a piezoelectric actuator stack.

FIGS. 6A-6B respectively show an exploded view of a nonlimiting example of a piezoelectric actuator system 100 that may be incorporated in a drill string for eliminating/mitigating stick slip, and a view of the this attachment or module assembled with the drill string 105 and drill bit 110. In the examples shown, the components of the piezoelectric actuator system are exposed for illustration. However, in some embodiments, an outer tubular housing may be provided to prevent exposure. In some embodiments, the drill string 105 may be connected to the piezoelectric actuator system 100 with a torque coupling element 115, and the drill bit 110 may be attached to the bottom of the actuator 100. A plurality of bar or tubes 117 (e.g. steel or any other suitable material) around the outer circumference of the actuator 100 where a first end is secured to the torque coupling element 115 and a second end is secured to a sleeve of an ultrasonic horn. A collared portion of the torque coupling element 115 may be used to secure rods 117 to a collared portion of the sleeve of the ultrasonic horn (discussed further below). It shall be clear to one of ordinary skill in the art that the rods or tubes 117 provide structural support or rigidity to the system 100.

FIG. 7 and FIGS. 8A-8C show further details of a piezoelectric actuator system 100. The top portion of the actuator may provide a prestressed bolt 120. The shank of the prestressed bolt 120 may serve as a shaft that fits through the center of back mass 125, piezoelectric plate(s) 130, and front mass 135, and the tip of the bolt may be threaded or the like to allow coupling to the ultrasonic horn 140. The one or more piezoelectric plates(s) 130, or collectively piezoelectric stack, are stacked between the back mass 125 and front mass 135. The piezoelectric plates or stacks 130 are formed of piezoelectric materials. When voltage is applied to the piezoelectric plate(s) 130, the plates vibrate at a high frequency and low amplitude. The pre-stress on the piezoelectric plate(s) 130 could be changed by tightening or by loosening the pre-stress bolt. Changing the weight and shape of the front mass 135 and back mass 125 change the system's 100 resonance frequency. The ultrasonic horn 140 in design allows the vibrational energy to be concentrate at the tip of horn.

FIG. 8A shows the piezoelectric actuator system 100 with the bottom cap assembly 145, FIG. 8B shows a cross section view, and FIG. 8C shows the bottom cap. The free-mass 155 is located near the bottom of the piezoelectric actuator 100 with a portion of the keyed shaft passing through the center. The bottom cap assembly 145 is secured to ultrasonic horn 140. A sleeve 150 fits over the bottom of the ultrasonic horn 140 to secure the free-mass 155. In particular, the sleeve 150 for the ultrasonic horn 140 provides a lower collared portion that allows previously discussed rods 117 (e.g. FIGS. 6A-6B) to be positioned between the upper collared portion of the torque coupling element 115 and lower collared portion of the sleeve. The sleeved 150 may also be secured to the ultrasonic horn 140 and allows the entire assemblies shown in FIGS. 7 and 8A-8C to be secured to each other. A bottom cap 165 with a key slot fits over a portion of the sleeve and the keyed shaft to allow the free mass 150 and keyed shaft 160 to be secured to the bottom cap assembly 145.

It should be noted free mass 150 fits within a chamber or void that is sized slightly larger than the free mass to provide a small clearance/recess. As a nonlimiting example, the bottom portion of the sleeve 150 and bottom cap 165 may be threaded to allow them to be mated together and leave a chamber or void for the free mass 150. It should be apparent that the clearance also allows the free mass 150 and keyed shaft 160 to freely move up and down a predetermined amount or distance. Because the drill bit is coupled to the bottom of the keyed shaft, the bit may also move up and down as well. During high frequency vibrations transferred from the piezoelectric plate(s) 130, the free mass 150 vibrates up and down on the keyed shaft 160 within the recess to transform the high frequency, low amplitude vibrations into low frequency, high amplitude vibrations. In particular, the piezoelectric plate(s) 130 may generate high frequency, low amplitude vibration. As the piezoelectric plate(s) 130 vibrate, the high frequency, low amplitude vibrations travel to the front mass 135, ultrasonic horn 140, and the bottom cap assembly 145. Based on the size and shape, the free mass can translate the vibrations received from the actuator into lower frequency vibrations. For example, based on the size and shape of the free mass 155, the high frequency vibrational energy of the piezoelectric plate(s) 130 can be transferred to the free mass 155, which causes the free mass 155 to actuate and freely vibrate in the chamber for the free mass at a lower frequency. This vibrating free mass 150 impacts the top side of keyed shaft 160 creating high amplitude impacts. As a result, low frequency and high amplitude vibrations are generated on the key shaft 160 connected to drill bit. In some embodiments, this free mass 155 could be coupled with key shaft 160. These high amplitude vibrations could help to reduce the occurrences of stick slip, as shown in FIG. 4 illustration of bit 1 avoiding stick slip on rock 5.

Figures 9A, 9B, 9C:
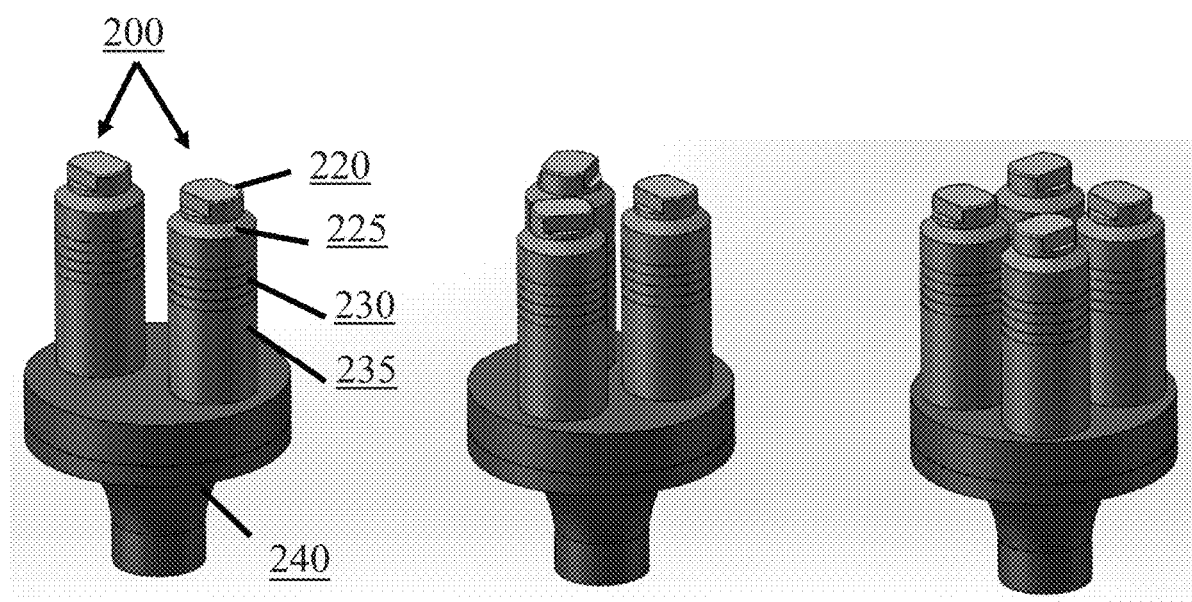
FIGS. 9A-9C show embodiments providing multiple piezoelectric actuator stacks installed on an ultrasonic horn.

As shown in FIGS. 9A-9C, in some embodiments, multiple sets of piezoelectric actuators 200 could be installed on an ultrasonic horn 240. As in prior embodiments, each individual piezoelectric actuator may include a prestressed bolt 220, back mass 225, piezoelectric plates or stacks 230, and front mass 135 serving the same purposes and providing the same functionality as discussed previously. As before, the ultrasonic horn 240 allows vibrational energy to be concentrate at the tip of horn. In some embodiments, the ultrasonic horn 240 may be designed to receive two or more piezoelectric actuators 200. These piezoelectric actuators 200 could have same and/or different pre-stress value on piezoelectric actuators. The pre-stress value selection could help to target a particular frequency or wide band of frequencies, and could be based on the drilling requirements. While a bottom cap assembly is not shown, it shall be recognized by one of ordinary skill in the art that a bottom cap assembly similar to the assembly shown in FIGS. 8A-8C may be provided for the embodiments shown in FIGS. 9A-9C.

Figure 5:
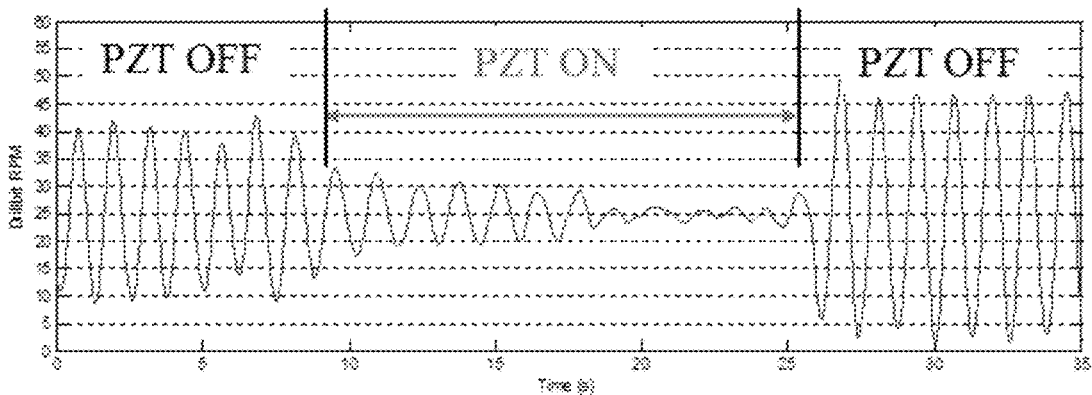
FIG. 5 shows drill RPM response when the proposed device is on or off.

A nonlimiting example of a method for eliminating rock bit stick-slip is discussed herein. The piezoelectric actuator system may comprise one or more embodiments of the piezoelectric actuator(s) discussed above. The method(s) discussed herein may apply to one or more of piezoelectric actuator(s) either individually or in combination with another. In some embodiments, one or more of the piezoelectric actuators may be activated while the drilling string is drilling. FIG. 5 shows a nonlimiting example of the drill bit RPM v. time. In the nonlimiting example, the drill bit is operating at a set RPM (e.g. 25 rpm). It can be seen that the actual RPM of the drill bit may vary, especially when the piezoelectric actuator is off (e.g. between about 0 to 9 seconds and 25-35 seconds). In some embodiments, the piezoelectric actuator(s) may be activated for a predetermined period of time when drilling is conducted. In some embodiments, the piezoelectric actuator may repeatedly cycle between off and on cycles while drilling is conducted. In yet another embodiment, the piezoelectric actuator may become active throughout the entire time drilling is being conducted. In some embodiments, the piezoelectric actuator(s) may be activated according to certain drilling conditions. As a nonlimiting example, the drill string may provide sensor(s) that detect drilling torque, and the piezoelectric actuator(s) may be activated based on an increase in drilling torque.

In some embodiments, the power supply can tune the excitation frequency of piezoelectric actuator (without any interference from human) to certain frequencies which are suitable for optimum drilling and avoiding stick-slip, such as by adjusting the voltage and/or current applied to the piezoelectric actuator.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

A preliminary testing done on a small scale was performed and has shown the effectiveness of the proposed technique. For testing, a prototype piezoactuator with free mass was developed and utilized the second option where the developed independent piezoelectric actuators was installed on a drill string between top drive and the rock bit (close to rock bit). Several concrete specimens with/without aggregates were used to mimic actual drilling scenarios with stick-slip. The setup was operated at 25 RPM. Results of the test (shown in FIG. 5) clearly indicates that when piezoelectric actuator is active (ON), the fluctuation in drill bit rpm (which corresponds to stick slip) reduces by a great percentage.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A system for avoiding stick slip during drilling operations, the system comprising:
   at least one piezoelectric plate, wherein the piezoelectric plate vibrates when voltage is applied;
   an ultrasonic horn coupled to the piezoelectric plate, wherein the ultrasonic horn concentrates vibrational energy at a tip of the ultrasonic horn;
   a keyed shaft, wherein the keyed shaft is utilized to couple the system to a drill bit wherein the system is an attachment incorporated in a drill string;
   a coupling element, wherein the coupling element is utilized to couple the system to the drill string;
   a sleeve coupled to the ultrasonic horn, wherein the sleeve provides a lower collared portion, and the coupling element provides an upper collared portion; and
   a plurality of rods positioned between the upper collared portion and the lower collared portion, wherein the plurality of rods secure the coupling element to the sleeve.

2. The system of claim 1 further comprising:
   a bottom cap assembly coupled to the ultrasonic horn providing a free mass chamber; and
   a free mass positioned in the free mass chamber, wherein the free mass absorbs the vibrational energy.

3. The system of claim 2, wherein the free mass translates vibrations received from the piezoelectric plates into lower frequency and higher amplitude vibrations.

4. The system of claim 2, wherein the bottom cap assembly comprises
   a bottom cap coupled to the sleeve, wherein the free mass chamber is provided between the bottom cap and the sleeve.

5. The system of claim 4, wherein the bottom cap provides a keyed slot, and a keyed portion of the keyed shaft fits through the keyed slot.

6. The system of claim 5, wherein the free mass provides an opening for receiving a portion of the keyed shaft.

7. The system of claim 1 further comprising:
a first piezoelectric actuator comprising the piezoelectric plate, a back mass, and a front mass, wherein the piezoelectric plate is sandwiched between the back mass and the front plate, and
a prestressed bolt securing the back mass, the front mass, and the piezoelectric plate to the ultrasonic horn.

8. The system of claim 1 further comprising:
a second piezoelectric actuator comprising at least a second piezoelectric plate, wherein the second piezoelectric actuator is coupled to the ultrasonic horn.

9. The system of claim 8, wherein the second piezoelectric actuator further comprises:
a second front mass and a second back mass, wherein the second piezoelectric plate is sandwiched between the second front mass and the second back mass; and
a second prestressed bolt securing the second back mass, the second front mass, and the second piezoelectric plate to the ultrasonic horn.

10. The system of claim 1, wherein the system is incorporated at a top end of the drill string near the surface of a well.

11. The system of claim 1, wherein the system is incorporated in between a top end of the drill string and the drill bit.

12. The system of claim 11, wherein the system is incorporated before a bottom hole assembly (BHA).

13. The system of claim 11, wherein the system is incorporated in a bottom hole assembly (BHA).

14. The system of claim 1 further comprising a power supply providing power to the at least one piezoelectric plate.

15. A system for avoiding stick slip during drilling operations, the system comprising:
a drill bit providing a plurality of openings for receiving drilling inserts;
one or more piezoelectric actuators, wherein each piezoelectric actuator is positioned at a bottom of one of the plurality of openings of the drill bit; and
a plurality of drill inserts positioned in the plurality of openings, wherein when piezoelectric actuators are present in the plurality of openings, the piezoelectric actuators are sandwich between the drilling inserts and a bottom of the opening of the drill bit; and
a power supply coupled to a drill string of the drill bit, wherein a first end of the piezoelectric actuator is coupled to a first pole of a power supply and the first end is electrically isolated from the drill bit.

16. The system of claim 15, wherein the piezoelectric actuators are placed in all of the plurality of openings.

17. The system of claim 15, wherein the piezoelectric actuators are placed in less than all the openings.

18. The system of claim 15 further comprising a casing, wherein a second pole of the power supply is coupled to the casing and a second end of the piezoelectric actuator.

19. A method for avoiding stick slip during drilling operations, the method comprising:
operating a drill string for drilling, wherein the drill string includes a drill bit and a system for avoiding stick slip comprising
at least one piezoelectric plate, wherein the piezoelectric plate vibrates when voltage is applied,
an ultrasonic horn coupled to the piezoelectric plate, wherein the ultrasonic horn concentrates vibrational energy at a tip of the ultrasonic horn, and
a keyed shaft coupled a free mass, wherein the keyed shaft is utilized to couple the system to a drill bit;
activating the system for avoiding stick slip while drilling for a predetermined period of time, wherein the system for avoiding stick slip is activated based on an increase in drilling torque.

20. The method of claim 19, wherein the system for avoiding stick slip is cycled between off cycles and on cycles while drilling is conducted.

21. The method of claim 19, wherein the system for avoiding stick slip is active throughout an entire time drilling is being conducted.

* * * * *